United States Patent
Park

(10) Patent No.: US 7,176,734 B2
(45) Date of Patent: Feb. 13, 2007

(54) CLOCK SIGNAL GENERATION CIRCUITS AND METHODS USING PHASE MIXING OF EVEN AND ODD PHASED CLOCK SIGNALS

(75) Inventor: Kwang-il Park, Gyeonggi-do (KR)

(73) Assignee: Samsung Electronics Co., Ltd. (KR)

( * ) Notice: Subject to any disclaimer, the term of this patent is extended or adjusted under 35 U.S.C. 154(b) by 43 days.

(21) Appl. No.: 11/066,072

(22) Filed: Feb. 25, 2005

(65) Prior Publication Data

US 2005/0189979 A1 Sep. 1, 2005

(30) Foreign Application Priority Data

Feb. 26, 2004 (KR) .................. 10-2004-0013009

(51) Int. Cl.
*H03L 7/00* (2006.01)

(52) U.S. Cl. .................. 327/161; 327/163; 327/291

(58) Field of Classification Search ............. 327/291, 327/172–176, 161–163, 165, 166
See application file for complete search history.

(56) References Cited

U.S. PATENT DOCUMENTS

| | | | | |
|---|---|---|---|---|
| 6,466,071 | B2 * | 10/2002 | Kim et al. | 327/175 |
| 6,768,361 | B2 * | 7/2004 | Kwak | 327/158 |
| 6,897,693 | B2 * | 5/2005 | Kim | 327/158 |
| 6,956,418 | B2 * | 10/2005 | Kwak et al. | 327/158 |
| 6,963,235 | B2 * | 11/2005 | Lee | 327/158 |
| 7,016,452 | B2 * | 3/2006 | Partsch et al. | 375/376 |
| 2003/0012322 | A1 | 1/2003 | Partsch et al. | |
| 2003/0219088 | A1 * | 11/2003 | Kwak | 375/376 |

FOREIGN PATENT DOCUMENTS

| | | |
|---|---|---|
| KR | 2001-094529 A | 11/2001 |
| KR | 10-2003-0002436 | 1/2003 |
| KR | 10-2003-0090129 | 11/2003 |
| KR | 2003-090129 A | 11/2003 |

OTHER PUBLICATIONS

Notice to Submit a Response for Korean Patent Application No. 10-2004-0013009 mailed on Sep. 28, 2005.

* cited by examiner

*Primary Examiner*—Timothy P. Callahan
*Assistant Examiner*—Hai L. Nguyen
(74) *Attorney, Agent, or Firm*—Myers Bigel Sibley & Sajovec PA

(57) ABSTRACT

A clock signal generation circuit includes a Delay Locked Loop (DLL) that, responsive to an input clock signal and first and second feedback clock signals, generates a plurality of phased clock signals time-shifted with respect to one another. The clock signal generation circuit further includes a phase mixer that receives the plurality of phased clock signals, that phase mixes first and second groups of the plurality of phased clock signals to generate the respective first and second feedback signals, and that phase mixes the first and second feedback signals to generate an output clock signal. The phased plurality of clock signals may be separated by substantially uniform delays, the first group of clock signals may include signals delayed even numbers of delays with respect to the input clock signal, and the second group of clock signals may include signals delayed odd numbers of delays with respect to the input clock signal. Each of the substantially uniform delays may be approximately one-half of a period of the input clock signal.

11 Claims, 4 Drawing Sheets

CLOCK SIGNAL GENERATION CIRCUITS AND METHODS USING PHASE MIXING OF EVEN AND ODD PHASED CLOCK SIGNALS

RELATED APPLICATION

This application claims the priority of Korean Patent Application No. 2004-13009, filed on Feb. 26, 2004, in the Korean Intellectual Property Office, the disclosure of which is incorporated herein in its entirety by reference.

BACKGROUND OF THE INVENTION

The present invention relates to clock signal generation circuits and methods, and more particularly, to clock signal generation circuits and methods that provide duty cycle control.

Many systems, including semiconductor memory devices, such as RDRAM (Rambus Dynamic Random Access Memory) and DDR (Double Data Rate) memory devices, systems for processing video signals and/or audio signals, and communication systems, include a clock generation circuit that uses a DLL (Delay Locked Loop) to generate an accurate clock signal. A typical clock signal generation circuit processes an input clock signal and generates a new clock signal with a predetermined duty factor. The duty factor is a percentage of a value obtained by dividing a time of a logic high pulse width of a clock signal by a period of the clock signal. A clock signal with a duty factor of 50% is used in many systems, but a clock signal with a different duty factor may be needed for some circuits. In order to ensure normal system operation, a clock signal generation circuit for generating a clock signal with a constant duty factor may be used.

FIG. 1 is a block diagram of a conventional duty cycle correcting clock signal generation circuit 100. Referring to FIG. 1, the circuit 100 includes a DLL 110, an inverter 120, and a phase mixer 130. A clock signal CKIN input to the circuit 100 may have a certain jitter due to duty cycle distortion. The clock signal generation circuit 100 outputs a new clock signal CKOUT having a duty factor of approximately 50%. The DLL 110 produces a signal DO that is delayed (for example, 180°) with respect to the input clock signal CKIN using a feedback signal DOB produced by the inverter 120 in order to correct a phase of the output clock signal CKOUT. The signal DOB produced by the inverter 120 is mixed with the input clock signal CKIN in the phase mixer 130, which generates an output clock signal CKOUT. The circuit 100 is disclosed in detail in Korean Laid-open Patent No. 01-0095537 to Gyu-Hyun Kim and Jung-Bae Lee.

The conventional clock signal generation circuit 100 can reduce jitter due to internal noise of the DLL 110, but can increase a jitter of the input clock signal CKIN arising from internal noise of the DLL 110, thereby causing jitter peaking. FIG. 2 is a view explaining jitter peaking in the DLL 110. As shown in FIG. 2, jitter peaking is a phenomenon in which when a jitter of δ1 exists in an input clock signal CKIN, a phase-corrected value of δ2 is added to the jitter of δ1 by the DLL 110, thereby generating a greater jitter in an output clock signal CKOUT.

An example using an oscillator-type phase filter to remove such jitter peaking, is described in an article "Jitter Transfer Characteristics of Delay-Locked Loops-Theories and Design Techniques" by Edward Lee, William J. Dally, Trey Greer, Hiok-Tiaq Ng, Ramin Farjad-Rad, John Poulton and Ramesh Senthinathan, *IEEE JSSC* vol. 38, NO. 4, APRIL 2003. However, using the oscillator-type phase filter can change a frequency of the output clock signal CKOUT and cause jitter accumulation, which can produce a greater jitter.

SUMMARY OF THE INVENTION

In some embodiments of the present invention, a clock signal generation circuit includes a Delay Locked Loop (DLL) that, responsive to an input clock signal and first and second feedback clock signals, generates a plurality of phased clock signals time-shifted with respect to one another. The clock signal generation circuit further includes a phase mixer that receives the plurality of phased clock signals, that phase mixes first and second groups of the plurality of phased clock signals to generate the respective first and second feedback signals, and that phase mixes the first and second feedback signals to generate an output clock signal. The phased plurality of clock signals may be separated by substantially uniform delays, the first group of clock signals may include signals delayed even numbers of delays with respect to the input clock signal, and the second group of clock signals may include signals delayed odd numbers of delays with respect to the input clock signal. Each of the substantially uniform delays may be approximately one-half of a period of the input clock signal.

In further embodiments, the phase mixer includes a first phase mixer that mixes the first group of phased clock signals to generate the first feedback clock signal and a second phase mixer that mixes the second group of phased clock signals to generate the second feedback clock signal. The phase mixer further includes a third phase mixer that mixes the first and second feedback clock signals to generate the output clock signal. The clock signal generation circuit may further include a lock detector that receives the first and second clock feedback signals, compares phases of the first and second clock feedback signals, and controls the first and second phase mixers responsive to the comparison. The lock detector may disable one of the first and second mixers if a phase difference between the first and second clock feedback signals is not substantially the same as the uniform delays, and may enable both of the first and second mixers if the phase difference between the first and second clock feedback signals is substantially equal to the uniform delays.

In further embodiments of the present invention, a clock signal generation circuit includes a DLL that generates a DLL output signal responsive to an input clock signal and a feedback signal, a phase mixer that phase mixes the input clock signal and the DLL output signal to generate a phase mixed signal, and an inverter that inverts one of the phase mixed signal or the DLL output signal to generate the feedback signal. The clock signal generation circuit may further include a lock detector that receives the input clock signal and the DLL output signal, that compares phases of the input clock signal and the DLL output signal, and that generates a multiplexer control signal responsive to the comparison. A multiplexer may receive the input clock signal and the DLL output signal and may selectively apply one of the phase mixed signal or the input clock signal to the inverter responsive to the multiplexer control signal.

The present invention may be implemented as apparatus and methods.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF EXEMPLARY EMBODIMENTS

The present invention will now be described more fully with reference to the accompanying drawings, in which embodiments of the invention are shown. This invention may, however, be embodied in different forms and should not be construed as being limited to the embodiments set forth herein. Rather, these embodiments are provided so that this disclosure will be thorough and complete, and will fully convey the scope of the invention to those skilled in the art. Like numbers refer to like elements. As used herein the term "and/or" includes any and all combinations of one or more of the associated listed items.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 1:
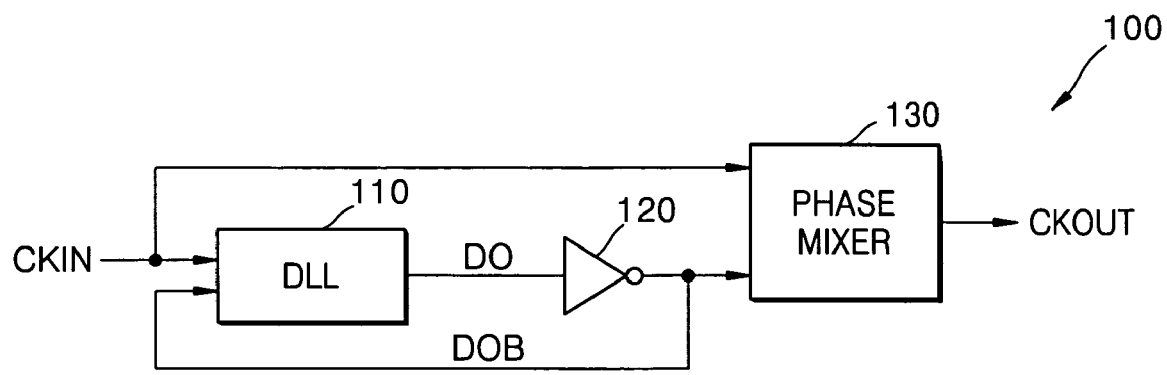
FIG. 1 is a schematic diagram of a conventional clock signal generation circuit.
Figure 2:
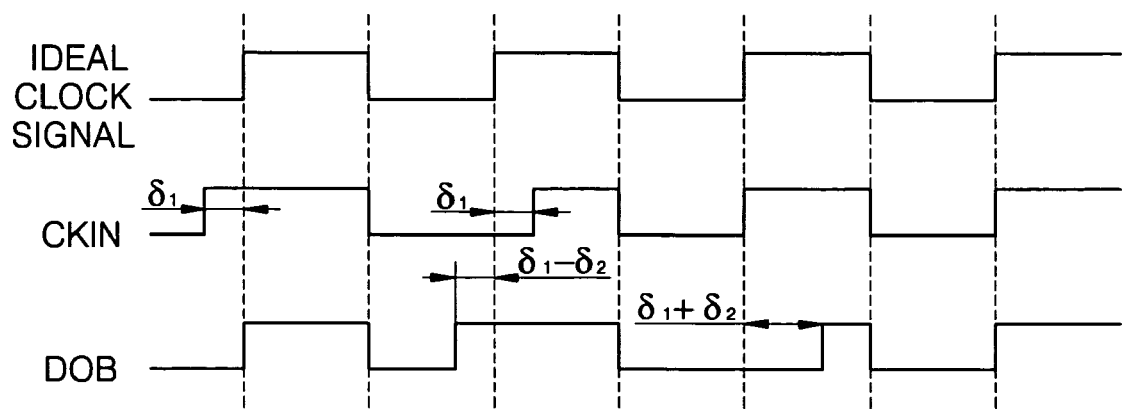
FIG. 2 is a diagram illustrating jitter peaking in a DLL.
Figure 3:
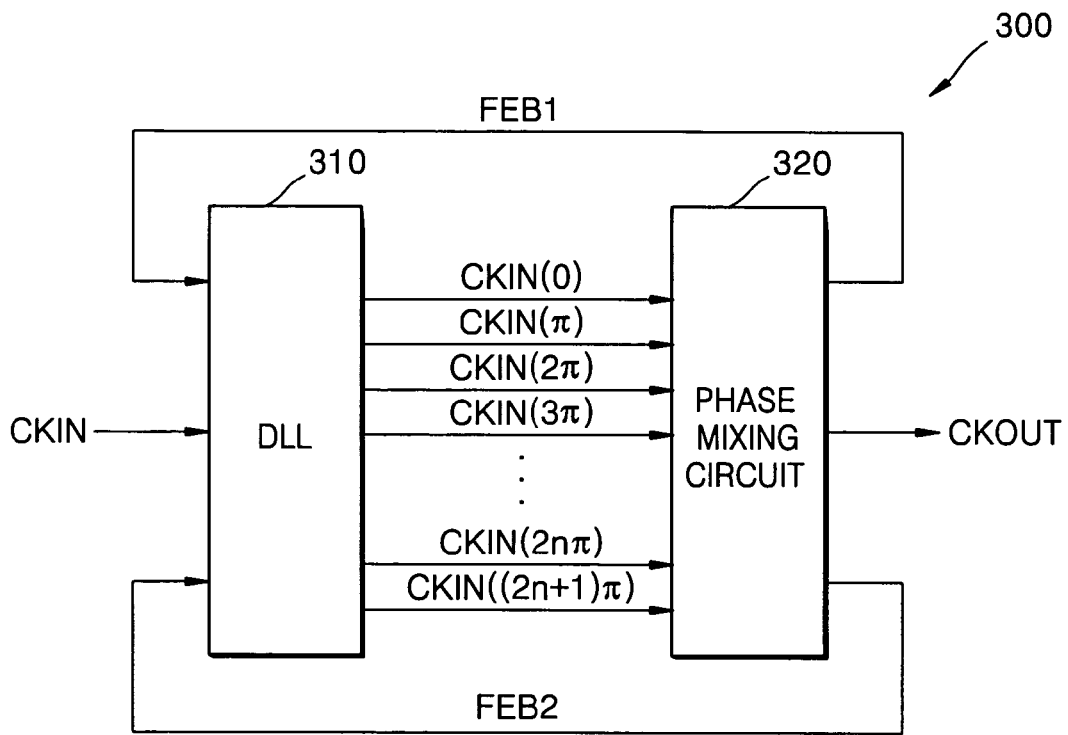
FIG. 3 is a block diagram of a clock signal generation circuit according to some embodiments of the present invention.

FIG. 3 is a block diagram of a duty cycle correcting clock signal generation circuit 300 according to some embodiments of the present invention. The clock signal generation circuit 300 includes a DLL (Delay Locked Loop) 310 and a phase mixing circuit 320. The DLL 310 receives an input clock signal CKIN, along with a first phase mixed signal FEB1 and a second phase mixed signal FEB2 fed back from the phase mixing circuit 320. The DLL 310 responsively generates a plurality of phased clock signals, including a group of clock signals CKIN(0)–CKIN(2nπ) with a first phase difference of 2nπ with respect to the input clock signal CKIN (i.e., delayed an even number of substantially uniformed delays π), and a plurality of signals CKIN(π)–CKIN(2n+1)π with, a second phase difference of (2n+1)π with respect to the input clock signal CKIN (i.e., delayed a odd number of substantially uniform delays π, where π represents a delay substantially equal to one-half period of the input clock signal CKIN, and where n is the total number of signals. An exemplary implementation of the DLL 310 will be described in more detail with reference to FIG. 4.

The phase mixing circuit 320 adjusts for a duty cycle errors in the input signal CKIN using the signals CKIN(0)–CKIN(2nπ) with the first phase difference and the signals CKIN(π)–CKIN(2n+1)π with the second phase difference, and generates an output signal CKOUT, the first phase mixed signal FEB1, and the second phase mixed signal FEB2. The phase mixing circuit 320 generates the output clock signal CKOUT, using the first phase mixed signal FEB1 obtained by mixing the signals CKIN(0)–CKIN(2n π) with the phase difference of 2nπ with respect to the input clock signal CKIN, and the second phase mixed signal FEB2 obtained by mixing the signals CKIN(0)–CKIN((2n+1)π) with the phase difference of (2n+1)π with respect to the input clock signal CKIN. By mixing the input clock signal CKIN with the signals CKIN(0)–CKIN(2nπ) having the phase difference of 2nπ with respect to the input clock signal CKIN, the phase mixing circuit 320 averages a total amount of jitter reflected on the signals. By mixing the input clock signal CKIN with the signals CKIN(π)–CKIN((2n+1)π) having the phase difference of (2n+1)π with respect to the input clock signal CKIN, the phase mixing circuit 320 averages a total amount of jitter in the signals. The phase mixing circuit 320 will be described in more detail with reference to FIG. 5.

The first phase mixed signal FEB1 and the second phase mixed signal FEB2 are fed back to the DLL 310. Some embodiments of the present invention arise from a realization that jitter of the even-delay signals CKIN(0)–CKIN(2nπ) generally is opposite of jitter of the odd-delay signals CKIN(π)–CKIN((2n+1)π). The clock signal generation circuit 300 according to the present invention may correct a duty cycle of an input clock signal CKIN while reducing or eliminating effects of input jitter, jitter due to internal noise of a DLL, jitter peaking, etc.

Figure 4:
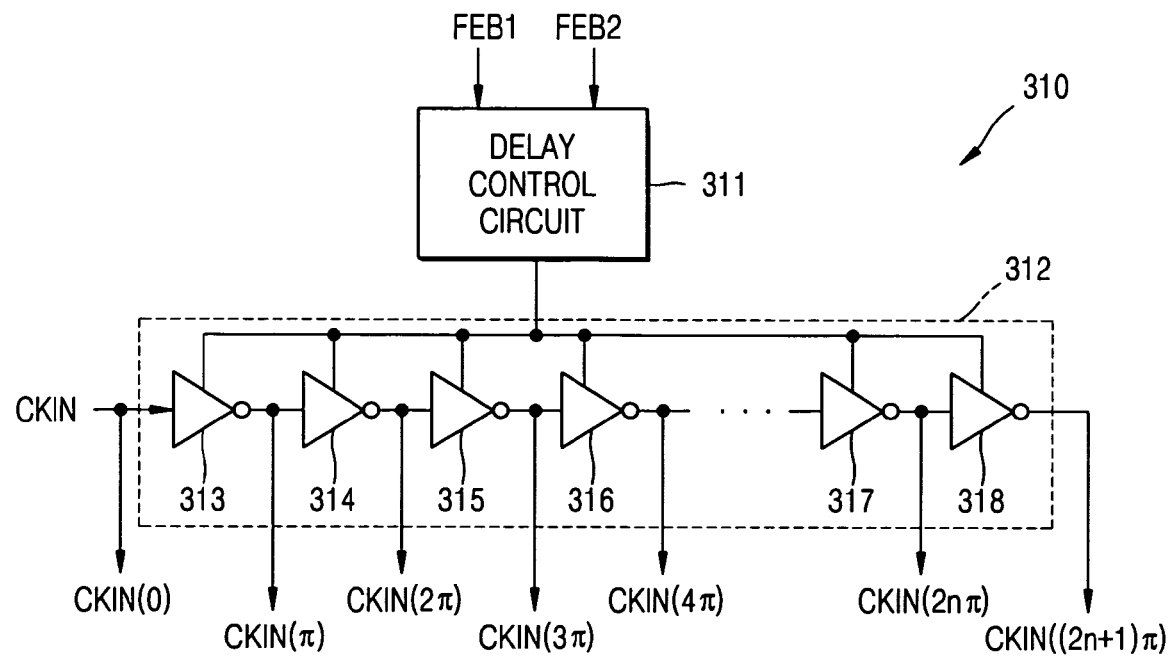
FIG. 4 is a schematic diagram of a DLL that may be used in the clock signal generation circuit of FIG. 3 according to further embodiments of the present invention.

FIG. 4 is a detailed block diagram of an exemplary implementation of the DLL 310 of FIG. 3 according to some embodiments of the present invention. The DLL 310 includes a delay control circuit 311 and a plurality of delay cells 312, which are connected in series. The delay control circuit 311 outputs a delay control voltage in response to the first phase mixed signal FEB1 and the second phase mixed signal FEB2. The delay control circuit 311 controls an amount of delay of the signals CKIN(0)–CKIN(2nπ) and the signals CKIN(π)–CKIN((2n+1)π) with respect to the input clock signal CKIN. In particular, when an input clock signal CKIN has a certain amount of jitter, the delay control circuit 311 determines an amount of jitter needed to compensate for the jitter of the input clock signal CKIN, in order to generate an output clock signal CKOUT with a duty cycle of approximately 50%.

The plurality of delay cells 312 generate the signals CKIN(0)–CKIN(2nπ) with a first phase difference with respect to the input clock signal CKIN and signals CKIN (π)–CKIN(2n+1)π with a second phase difference with respect to the input clock signal CKIN responsive to the delay control voltage. Each of the delay cells 313–318 provides an input/output phase difference of π. The delay cells 313–318 may be, for example, MOSIFET (Metal-Oxide-Semiconductor Field Effect Transistor) inverter circuits.

Figure 5:
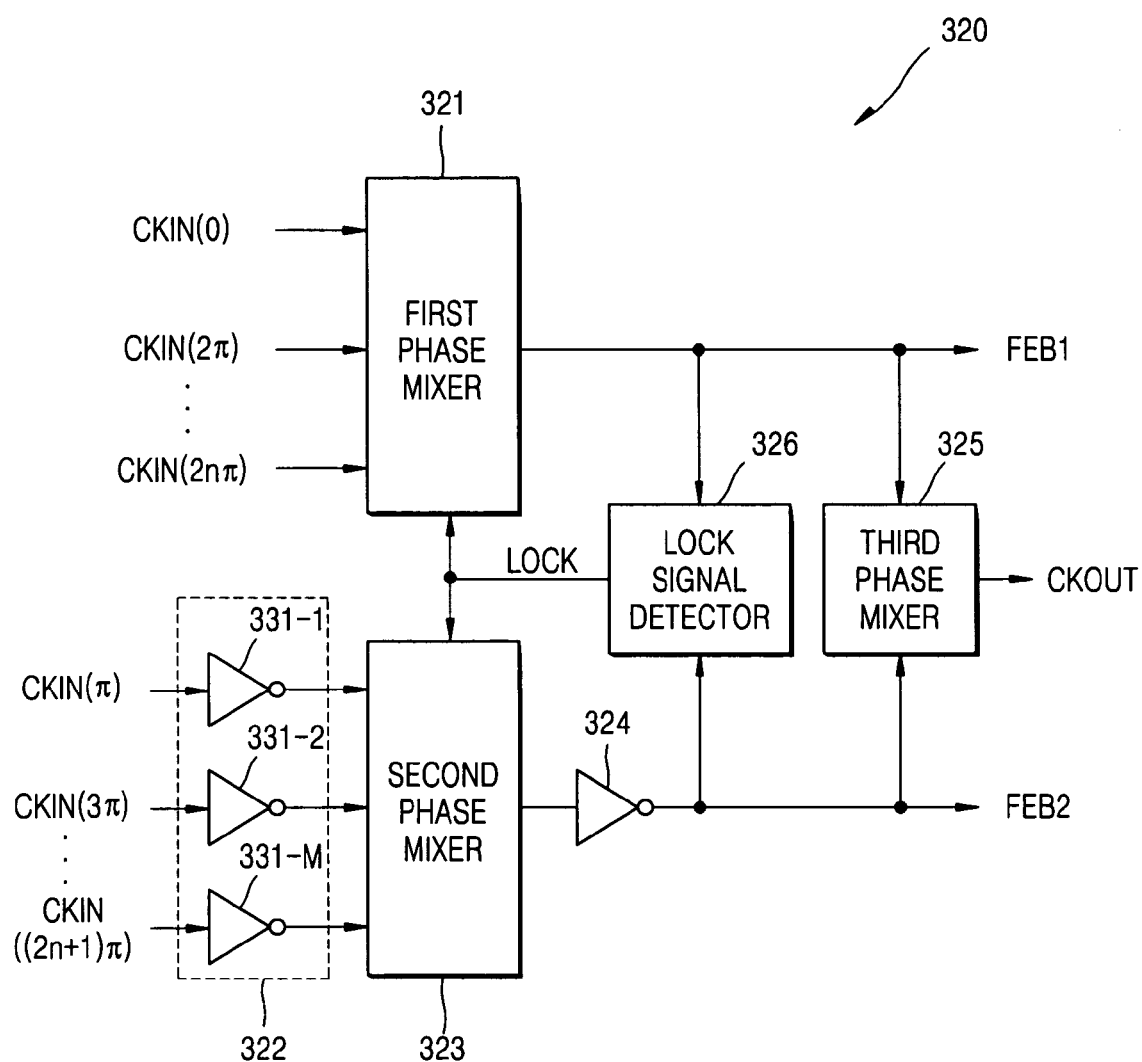
FIG. 5 is a schematic diagram of a phase mixing circuit that may be used in the clock signal generation circuit of FIG. 3 according to further embodiments of the present invention.

FIG. 5 is a detailed block diagram of an exemplary implementation of the phase mixing circuit 320 of FIG. 3 according to some embodiments of the present invention. The phase mixing circuit 320 includes a first phase mixer 321, a plurality of inverting circuits 322, a second phase mixer 323, an inverting circuit 324, a third phase mixer 325, and a lock signal detector 326.

The first phase mixer 321 phase-mixes the signals CKIN(0)–CKIN(2nπ) and generates a first phase mixed signal FEB1 with a phase that is an average of the phases of the signals CKIN(0)–CKIN(2nπ). The plurality of inverting circuits 322 inverts the signals CKIN(π)–CKIN(2n+1)π through inverters 331-1 to 331-M, respectively. The second phase mixer 323 phase-mixes the inverted signals produced from the signals CKIN(π)–CKIN(2n+1)π and outputs a signal with a phase that is an average of the phases of the inverted signals. The inverting circuit 324, which may be a MOSFET inverter, inverts the output signal of the second phase mixer 323 to output the second phase mixed signal FEB2. Through the inverting circuit 324, a signal with phase that is an average of the phases of the signals CKIN(π) –CKIN(2n+1)π with the second phase difference is output. The third phase mixer 325 phase-mixes the first phase mixed signal FEB1 and the second phase mixed signal FEB2 and generates the output clock signal CKOUT as a signal with an average phase of the two signals FEB1 and FEB2. A signal with a phase that is an average of the phases of two signals may have its rising edge at a middle location of rising edges of the two signals and may have its falling edge at a middle location of falling edges of the two signals.

Figure 6:
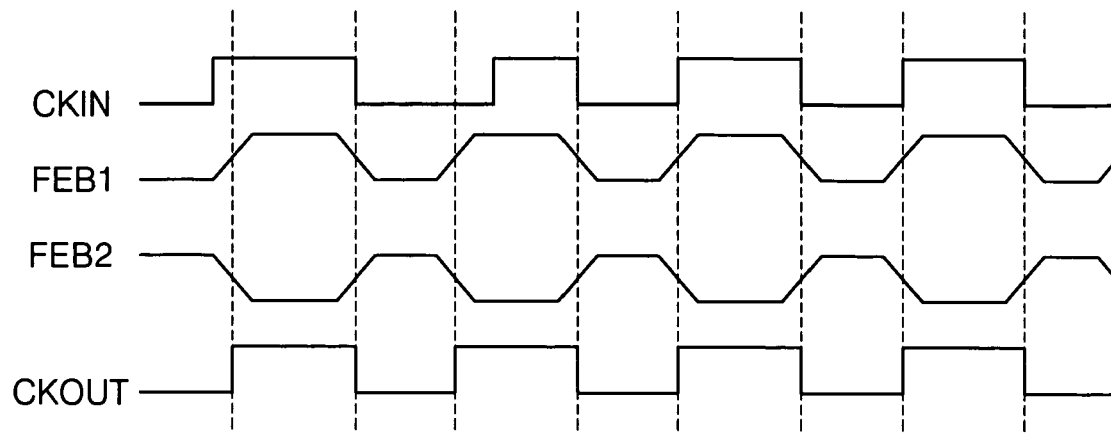
FIG. 6 is a timing diagram illustrating exemplary operations of the clock signal generation circuit of FIG. 3 according to some embodiments of the present invention.

The first phase mixed signal FEB1 is obtained by mixing and averaging with signals CKIN(π)–CKIN(2nπ) with a phase difference of 2nπ with respect to the input clock signal CKIN, as shown in FIG. 6. Likewise, the second phase mixed signal FEB2, which has a phase difference of π with respect to the first phase mixed signal FEB1, is obtained by mixing and averaging signals CKIN(π)–CKIN(2n+1)π with a phase difference of (2n+1)π with respect to the input clock signal CKIN, as shown in FIG. 6. The first phase mixed signal FEB1 and the second phase mixed signal FEB2 are phase-mixed in the third phase mixer 325 in order to generate the output clock signal CKOUT as an output clock with an approximately 50% duty factor.

A waveform of such an output clock signal CKOUT is illustrated in FIG. 6. As such, because the signals CKIN(0) –CKIN(2n+1)π passing through the plurality of delay cells 313–318 are mixed by the first and second phase mixers 321 and 323 so that jitter is averaged and jitter peaking by the input clock signal CKIN may be reduced. Power supply noise included in the signals CKIN(0)–CKIN(2n+1)π which passed through the plurality of delay cells 313–318 have different influences on the signals CKIN(0)–CKIN(2nπ) and on the signals CKIN(0)–CKIN((2n+1)π), so that jitter of the signals CKIN(0)–CKIN(2nπ) become opposite respectively to those of the signals CKIN(0)–CKIN((2n+1)π). That is, as phases of the signals CKIN(0)–CKIN(2nπ) increase, phases of the signals CKIN(0)–CKIN((2n+1)π) decrease. Accordingly, by mixing the first phase mixed signal FEB1 and the second phase mixed signal FEB2 in the third phase mixer 325, the power supply noise may be reduced or removed and the accuracy of the duty cycle of the output clock signal CKOUT can be improved. A jitter amount (CKOUT of the output clock signal CKOUT may be reduced in proportion to a reciprocal of a square root of the number N of the signals CKIN(0)–CKIN(2nπ) phase-mixed by the first and second phase mixers 321 and 323, as seen in an equation (1):

$$\sigma_{CKOUT} = \sqrt{\frac{\sum (\sigma^i_{CKIN(2n\pi)})^2 + \sum (\sigma^i_{CKIN(2n+1)\pi})^2}{N}} \quad (1)$$

Referring again to FIG. 5, the phase mixing circuit 320 further includes a lock signal detector 326 for reducing unsettling of the output clock signal CKOUT due to a malfunction of the delay control circuit 311 during an unstable transitional period, such as power-on. The lock signal detector 326 checks a phase difference between the first phase mixed signal FEB1 and the second phase mixed signal FEB2 and generates a lock signal LOCK with different logic states of a first logic state and a second logic state, according to whether or not the phase difference between the two signals is substantially equal to a predetermined phase difference π. Because an initial transitional period, such as power-on, may be unstable, a case where the phase difference between the first phase mixed signal FEB1 and the second phase mixed signal FEB2 is not π, can occur.

If the phase difference between the first phase mixed signal FEB1 and the second phase mixed signal FEB2 is not π, that is, if the lock signal LOCK is in a first logic state (for example, a logic low state), the first phase mixer 321 does not output the first phase mixed signal FEB1 and the second phase mixer 323 selectively outputs the inverted signal of a signal with a phase difference of π with respect to the input clock signal CKIN, among the signals CKIN(π)–CKIN(2n+ 1)π with the second phase difference with respect to the input clock signal CKIN. That is, the second phase mixer 323 outputs only the output from the inverter 331-1.

If the phase difference between the first phase mixed signal FEB1 and the second phase mixed signal FEB2 is π, that is, if the lock signal LOCK is in a second logic state (for example, logic high state), the first phase mixer 321 performs phase mixing and outputs the first phase mixed signal FEB1, and the second phase mixer 323 phase-mixes the outputs from the plurality of inverters 322 and outputs the phase-mixed signal. When the phase difference between the first and second phase mixed signals FEB1 and FEB2 is not π, an output terminal of the first phase mixer 321 which outputs the first phase mixed signal FEB1 may be floated or set to a predetermined logic state (first or second logic state) so that the first phase mixer 321 does not output the first phase mixed signal FEB1.

The input clock signal CKIN can be input in the form of a pair of complementary signals consisting of a first clock signal and a complementary (inverted) second clock signal. A complementary pair of input clock signals may be used in a system requiring a pair of complementary output clock signals. If the input clock signal CKIN is input in a form of a complementary pair of signals, each of the corresponding first and second phase mixed signals FEB1 and FEB2 may also be generated in a form of a complementary pair of signals. In this case, the output clock signal CKOUT obtained by correcting the duty cycle of the input clock signal CKIN using the first and second phase mixed signals FEB1 and FEB2, may also be generated in a form of a complementary pair of signals. In more detail, the output clock signal CKOUT may be generated in a form of a pair of signals including a third clock signal obtained by correcting a duty cycle of the first clock signal and a fourth clock signal obtained by correcting a duty cycle of the second clock signal.

Figure 7:
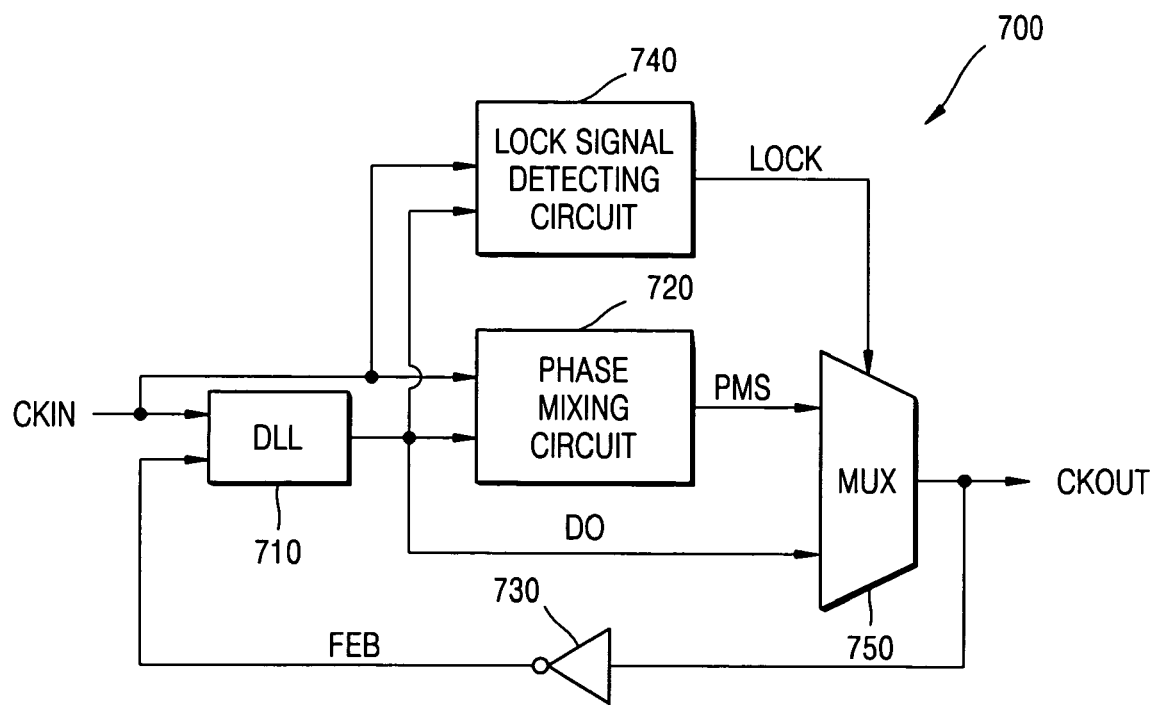
FIG. 7 is a block diagram of a clock signal generation circuit according to additional embodiments of the present invention.

FIG. 7 is a block diagram of a clock signal generation circuit 700 according to additional embodiments of the present invention. The clock signal generation circuit 700 includes a DLL 710, a phase mixing circuit 720, an inverting circuit 730, a lock signal detecting circuit 740, and a multiplexer 750. The DLL 710 compares a phase of an input clock signal CKIN with a phase of a phase mixed feedback signal, delays the input clock signal CKIN according to the compared result, and generates a signal DO with a phase difference $\pi$ with respect to the input clock signal CKIN. The DLL 710 of FIG. 7 generates a single signal DO with a phase difference of n with respect to the input clock signal CKIN, differently from the DLL 310 of FIG. 3. The DLL 710 generates a delay control voltage that controls a delay with respect to the input clock signal CKIN according to the compared result, and generates a signal DO with a predetermined phase difference of $\pi$ with respect to the input clock signal CKIN in response to the delay control voltage. When the input clock signal CKIN has jitter, the DLL 710 determines an amount of jitter required for offsetting the jitter of the input clock signal CKIN and generating an output clock signal CKOUT with a duty factor of approximately 50%, and delays the input clock signal CKIN by the determined amount of jitter. The phase mixing circuit 720 phase-mixes the input clock signal CKIN with the signal DO, and generates a signal PMS with phase that is an average of the phases of the two signals CKIN and DO. The signal PMS phase-mixed by the phase mixing circuit 720 is output through the multiplexer 750 to provide an output clock signal CKOUT. The inverting circuit 730 inverts the output clock signal CKOUT and outputs the inverted signal as a phase mixed signal FEB.

The clock signal generation circuit 700 further includes a lock signal detector 740 and a multiplexer 750, to reduce unsettling of the output clock signal CKOUT during an unstable transitional period, such as power-on. The lock signal detector 740 checks a phase difference between the input clock signal CKIN and the signal DO output from the DLL 710 and generates a lock signal LOCK with different logic states of a first logic state and a second logic state, according to whether or not the phase difference between the two signals CKIN and DO is a predetermined phase difference $\pi$. If the phase difference between the two signals CKIN and DO is not $\pi$, that is, if the lock signal LOCK is in a first logic state (for example, logic low state), the multiplexer 750 outputs, as the output clock signal CKOUT, the signal DO output from the DLL 710 according to the first logic state of the lock signal LOCK. Meanwhile, if the phase difference between the two signals CKIN and DO is $\pi$, that is, if the lock signal LOCK is in a second logic state (for example, logic high state), the multiplexer 750 outputs, as the output clock signal CKOUT, the signal PMS phase-mixed by the phase mixing circuit 720 according to the second logic state of the lock signal LOCK.

As described above, the clock signal generation circuits 300 and 700 according to the some embodiments of the present invention may reduce jitter of an input clocks signal CKIN and/or jitter due to internal noise of the DLLs 310 and 710, and may accurately correct a duty cycle of the input clock signal CKIN using a plurality of clock signals phased differently with respect to the input signal CKIN. In the clock signal generation circuit 700, as a signal to be fed back to the DLL 310, a phase-mixed signal FEB1 of signals CKIN(0)–CKIN(2n$\pi$) with a phase difference of 2n$\pi$ with respect to the input clock signal CKIN and a phase-mixed signal FEB2 of signals CKIN($\pi$)–CKIN((2n+1)$\pi$) with a phase difference of (2n+1)$\pi$ with respect to the input clock signal CKIN, is used. In the clock signal generation circuit 300, as a signal to be fed back to the DLL 710, the phase-mixed signal FEB of the input clock signal CKIN and the signal with a phase difference of $\pi$ with respect to the input clock signal CKIN is used.

As described above, a clock signal generation circuit according to embodiments of the present invention may significantly reduce input jitter, jitter due to internal noise of the DLL, jitter peaking, etc., and, accordingly, may accurately correct a duty cycle of an input clock signal. Therefore, some embodiments of the present invention can contribute to a stable operation of semiconductor memory devices, video/audio systems, communication systems, etc.

While this invention has been particularly shown and described with reference to exemplary embodiments thereof, it will be understood by those skilled in the art that various changes in form and details may be made therein without departing from the spirit and scope of the invention as defined by the appended claims.

That which is claimed is:

1. A clock signal generation circuit comprising:
    a Delay Locked Loop (DLL) that, responsive to an input clock signal and first and second feedback clock signals, generates a plurality of phased clock signals time-shifted with respect to one another; and
    a phase mixer that receives the plurality of phased clock signals, that phase mixes first and second groups of the plurality of phased clock signals to generate the respective first and second feedback signals, and that phase mixes the first and second feedback signals to generate an output clock signal.

2. The clock signal generation circuit of claim 1, wherein the phased plurality of clock signals are separated by substantially uniform delays, and wherein the first group of clock signals comprises signals delayed even numbers of delays with respect to the input clock signal, and wherein the second group of clock signals comprises signals delayed odd numbers of delays with respect to the input clock signal.

3. The clock signal generation circuit of claim 2, wherein the phase mixer comprises:
    a first phase mixer that mixes the first group of phased clock signals to generate the first feedback clock signal;
    a second phase mixer that mixes the second group of phased clock signals to generate the second feedback clock signal; and
    a third phase mixer that mixes the first and second feedback clock signals to generate the output clock signal.

4. The clock signal generation circuit of claim 3, further comprising a lock detector that receives the first and second clock feedback signals, compares phases of the first and second clock feedback signals, and controls the first and second phase mixers responsive to the comparison.

5. The clock signal generation circuit of claim 4, wherein the lock detector disables one of the first and second mixers if a phase difference between the first and second clock feedback signals is not substantially the same as the uniform delays, and wherein detector enables both of the first and second mixers if the phase difference between the first and second clock feedback signals is substantially equal to the uniform delays.

6. The clock signal generation circuit of claim 2, wherein each of the substantially uniform delays is approximately one-half of a period of the input clock signal.

7. The clock signal generation circuit of claim 1, wherein the DLL comprises:
   a delay control circuit that receives the first and second feedback signals and generates a delay control signal responsive thereto; and
   a plurality of series-connected delay circuits that generate respective ones of the plurality of phased clock signals responsive to the delay control signal.

8. A duty cycle control method comprising:
   generating a plurality of phased clock signals time-shifted with respect to one another responsive to comparison of an input clock signal and first and second feedback clock signals; and
   phase mixing first and second groups of the plurality of phased clock signals to generate the respective first and second feedback signals; and
   phase mixing the first and second feedback signals to generate an output clock signal.

9. The method of claim 8, wherein the phased plurality of clock signals are separated by substantially uniform delays, and wherein the first group of clock signals comprises signals delayed even numbers of delays with respect to the input clock signal, and wherein the second group of clock signals comprises signals delayed odd numbers of delays with respect to the input clock signal.

10. The method of claim 9, further comprising:
    comparing phases of the first and second clock feedback signals; and
    controlling mixing of the first and second groups of clock signals.

11. The method of claim 9, wherein each of the substantially uniform delays is approximately one-half of a period of the input clock signal.

* * * * *